US008044485B2

(12) United States Patent
Miyoshi et al.

(10) Patent No.: US 8,044,485 B2
(45) Date of Patent: Oct. 25, 2011

(54) SEMICONDUCTOR DEVICE

(75) Inventors: Makoto Miyoshi, Inazawa (JP);
Yoshitaka Kuraoka, Anjo (JP)

(73) Assignee: NGK Insulators, Ltd., Nagoya (JP)

( * ) Notice: Subject to any disclaimer, the term of this patent is extended or adjusted under 35 U.S.C. 154(b) by 197 days.

(21) Appl. No.: 11/692,290

(22) Filed: Mar. 28, 2007

(65) Prior Publication Data

US 2007/0228519 A1 Oct. 4, 2007

(30) Foreign Application Priority Data

Mar. 30, 2006 (JP) .................................. 2006-093209
Mar. 26, 2007 (JP) .................................. 2007-079097

(51) Int. Cl.
*H01L 29/47* (2006.01)
(52) U.S. Cl. ........ 257/471; 257/104; 257/167; 257/183; 257/194; 257/317; 257/480; 257/551; 257/603; 257/E29.339; 257/E29.338; 257/E33.034; 438/167; 438/317
(58) Field of Classification Search ........... 257/E29.339, 257/E29.338, E33.034, 551, 194, 471, 104, 257/480, 603, 183; 438/167, 317
See application file for complete search history.

(56) References Cited

U.S. PATENT DOCUMENTS

| 4,373,166 A * | 2/1983 | Bergeron et al. .............. 257/475 |
| 4,982,260 A * | 1/1991 | Chang et al. .................. 257/656 |
| 6,501,145 B1 * | 12/2002 | Kaminski et al. ............. 257/471 |
| 6,586,781 B2 * | 7/2003 | Wu et al. ...................... 257/194 |
| 6,727,531 B1 * | 4/2004 | Redwing et al. .............. 257/194 |
| 6,949,401 B2 * | 9/2005 | Kaminski et al. ................ 438/92 |
| 7,436,039 B2 * | 10/2008 | Zhu et al. ...................... 257/484 |
| 2001/0017370 A1 * | 8/2001 | Sheppard et al. ................. 257/24 |
| 2002/0066908 A1 * | 6/2002 | Smith ............................ 257/194 |
| 2005/0130454 A1 * | 6/2005 | Murthy et al. ................. 438/933 |
| 2005/0170574 A1 * | 8/2005 | Sheppard et al. ............. 438/172 |
| 2005/0280114 A1 * | 12/2005 | Singh ............................ 257/502 |

(Continued)

OTHER PUBLICATIONS

Quirk, Michael "Semiconductor Manufacturing Technology" 2001 Prentice Hall p. 75.*
R. Raghunathan and B. J. Baliga, "P-Type 4H and 6H-SiC High-Voltage Schottky Barrier Diodes", IEEE Electron Device Letters, vol. 19, No. 3, Mar. 1998, pp. 71-73.

(Continued)

*Primary Examiner* — David Vu
*Assistant Examiner* — Brandon Fox
(74) *Attorney, Agent, or Firm* — Burr & Brown (57) ABSTRACT

A semiconductor device made of a group-III nitride semiconductor having excellent properties is provided. The semiconductor device has a horizontal diode structure of Schottky type or P-N junction type, or combined type thereof having a main conduction pathway in the horizontal direction in a conductive layer with unit anode portions and unit cathode electrodes being integrated adjacently to each other in the horizontal direction. The conductive layer is preferably formed by depositing a group-III nitride layer and generating a two-dimensional electron gas layer on the interface. Forming the conductive layer of the group-III nitride having high breakdown field allows the breakdown voltage to be kept high while the gap between electrodes is narrow, which achieves a semiconductor device having high output current per chip area. Further, an electrode pad layer provided on an insulation protecting layer relieves electric field concentration at a junction of each unit anode portion and each unit cathode electrode, which achieves higher breakdown voltage.

19 Claims, 7 Drawing Sheets

U.S. PATENT DOCUMENTS

| | | | |
|---|---|---|---|
| 2006/0054926 A1* | 3/2006 | Lahreche | 257/194 |
| 2006/0071235 A1* | 4/2006 | Dehlinger et al. | 257/109 |
| 2006/0145283 A1* | 7/2006 | Zhu et al. | 257/472 |
| 2006/0197107 A1* | 9/2006 | Kanamura et al. | 257/194 |
| 2006/0214188 A1* | 9/2006 | Kawasaki et al. | 257/194 |
| 2008/0029838 A1* | 2/2008 | Zhang et al. | 257/475 |

OTHER PUBLICATIONS

Saito, Wataru et al., "Design and Demonstration of High Breakdown Voltage GaN High Electron Mobility Transistor (HEMT) Using Field Plate Structure for Power Electronics Applications", Japanese Journal of Applied Physics, vol. 43, No. 4B, 2004, pp. 2239-2242.

* cited by examiner

| | FIRST EXAMPLE | SECOND EXAMPLE | THIRD EXAMPLE | FOURTH EXAMPLE | COMPARATIVE EXAMPLE |
|---|---|---|---|---|---|
| REVERSE LEAKAGE CURRENT (nA) (AT 100V) | <1 | 100 | <1 | 4 | 500 |
| REVERSE BLOCKING BREAKDOWN VOLTAGE (V) | 1200 | 900 | 1200 | 1000 | 850 |
| OUTPUT CURRENT (A) | 30 | 20 | 30 | 30 | 20 |
| REVERSE RECOVERY TIME (ns) | 0 | 0 | 0 | 0 | 0 |
| PEAK SURGE CURRENT (A) | 300 | 42 | 300 | 250 | 42 |
| ON-STATE VOLTAGE (V) AT FORWARD CURRENT OF 10A | 2.7 | 4.2 | 2.1 | 3.1 | 4.6 |
| ON-STATE VOLTAGE (V) AT FORWARD CURRENT OF 1A | 1.6 | 1 | 1.6 | 1.6 | 1 |

SEMICONDUCTOR DEVICE

FIELD OF THE INVENTION

The present invention relates to a semiconductor device for power applications, and more particularly to a power inverter or converter circuit device.

DESCRIPTION OF THE BACKGROUND ART

A semiconductor-employed switching device (transistor, thyristor, etc.) or rectifier device (diode) is widely used as a power inverter or converter circuit device. Under the present circumstances, a more compact device with lower losses is preferable for such semiconductor device for power applications in order to meet future demands for higher power. While silicon has conventionally been used widely as a semiconductor material, wide band gap semiconductor materials having higher breakdown fields are being developed as next-generation semiconductor materials in light of the present circumstances. Since what is called wide band gap semiconductor materials such as diamond, SiC, group-III nitride semiconductor, etc. are expected to have low on-state resistance and high breakdown voltage for their material properties, significant size reduction and reduction in losses of a power controller are expected by constituting a semiconductor device for power applications using these materials.

Requirements on properties for such power diode include: (1) small leakage current during reverse blocking; (2) high breakdown voltage during reverse blocking; (3) large output current at forward conduction; (4) short reverse recovery time at shutoff; (5) high peak surge current value; and the like. Of course, a diode made of a wide band gap semiconductor material is required to meet these requirements.

Conventionally, what is called a vertical diode is generally used which conducts in a direction passing through a semiconductor substrate so as to ensure the requirements (2) and (3).

Conventionally practical, silicon-employed P—N junction diode and its modified P-i-N junction diode have advantages of high breakdown voltage at application of a reverse-bias voltage and high output current density at forward conduction because of the occurrence of carrier injection from both P and N sides, but also have a drawback of long reverse recovery time at shutoff, that is, the above requirement (4) is not satisfied.

On the other hand, a silicon-employed Schottky barrier vertical diode is also in practical use. Such diode has an advantage in that a reverse current at shutoff does not occur in principle, but has drawbacks of having large leakage current and low breakdown voltage at application of a reverse-bias voltage and low peak surge current. That is, the above requirements (1), (2) and (5) are not satisfied.

To improve the drawbacks of such silicon-employed diodes, a SiC-employed Schottky barrier vertical diode has been developed and is publicly known (cf. "P-Type 4H and 6H—SiC High Voltage Schottky Barrier Diodes" R. Raghunathan and B. J. Baliga, IEEE ELECTRON DEVICE LETTERS, Vol. 19, pp. 71-73 (1998)) (hereinafter called "Raghunathan's article").

Further, a high electron mobility transistor (HEMT) made of a group-III nitride material having what is called a field plate structure for achieving high breakdown voltage is publicly known (cf. "Design and Demonstration of High Breakdown Voltage GaN H Electron Mobility Transistor (HEMT) Using Field Plate Structure for Power Electronics Applications" W. Saito et al., Japanese Journal of Applied Physics Vol. 43, pp. 2239-2242 (2004)) (hereinafter called "Saito's article").

A SiC-employed Schottky barrier vertical diode as disclosed in the Raghunathan's article achieves the effect of increasing the breakdown voltage unlike a silicon-employed one, however, the drawbacks of not meeting the requirements (1) and (5) have not been solved so far.

SiC single crystal includes many crystal defects (specifically, tubular voids, what is called micropipes) and thus disadvantageously makes it difficult to manufacture with stability a device of relatively large area that can ensure sufficient output current, resulting in poor yields in manufacturing process.

Further, since a SiC-employed P—N junction diode causes carrier recombination resulting from such crystal, the output current is more likely to be limited, so that the above requirement (3) is not satisfied.

In terms of handling, it is held difficult to use a substrate having a thickness smaller than about 100 μm in manufacturing steps including semiconductor processing and assembly. In the case of a vertical diode, the thickness of substrate is directly reflected in the gap between electrodes. Since it is difficult to reduce the gap between electrodes in terms of handling, a problem arises in that a series resistance resulting from semiconductor layers cannot be sufficiently reduced.

A vertical diode made of a group-III nitride semiconductor instead of silicon or SiC is expected in principle to present properties equal to or more excellent than the SiC-employed one. When forming a vertical diode, a single crystal substrate having conductivity needs to be used as a substrate, however, a single crystal substrate of group-III nitride semiconductor is very expensive. In addition, when a device is configured as a P—N junction diode, P- and N-type conductive regions need to be formed inside a semiconductor layer. In either the P—N junction type or Schottky junction type, what is called a field limiting ring (FLR) needs to be provided. Accordingly, in either type, P- and N-type conductive regions need to be formed essentially. The use of group-III nitride semiconductor, however, arises a problem in that it is not easy to obtain a P-type conductive layer presenting high hole density that is applicable to a power diode.

Further, it is difficult to derive a configuration that achieves improved properties in a horizontal diode such as compatibility between high breakdown voltage and short reverse recovery time, from the HEMT having a field plate as disclosed in the Saito's article.

SUMMARY OF THE INVENTION

The present invention relates to a semiconductor device for power applications, and more particularly to a power inverter or converter circuit device.

The semiconductor device according to the invention comprises: a first semiconductor layer made of a wide band gap material in which electrons are majority carriers; an anode portion including a plurality of unit anode portions, the plurality of unit anode portions each being joined to a main surface of the first semiconductor layer and being electrically connected to each other; and a cathode portion including a plurality of unit cathodes, the plurality of unit cathodes each being joined to the main surface and being electrically connected to each other. Electrode rows including each of the plurality of unit anode portions and each of the plurality of unit cathodes arranged alternately are formed on the main surface.

Thus obtained semiconductor device has a main conduction pathway in parallel to the surface in the first semiconductor layer, and presents excellent properties as a diode of P—N junction type or Schottky junction type, or combination thereof. The use of a wide band gap material for the first semiconductor layer allows significant reduction of anode-to-cathode distance which is a dominant factor over a breakdown voltage, as compared to a semiconductor material such as silicon. This allows reduction in on-state resistance and reduction in device area, which in turn achieves improved output current density per chip area.

According to a first aspect of the invention, in the semiconductor device, the first semiconductor layer is a stack of first and second nitride layers, each being made of a group-III nitride having a composition of $Al_{1-x-y}Ga_xIn_yN$ ($x \geqq 0$, $y \geqq 0$, $0 \leqq x+y \leqq 1$) and being different in band gaps at least in an area where the first and second nitride layers are adjacent to each other.

Accordingly, a two-dimensional electron gas layer is created in the vicinity of the interface between the first and second nitride layers, and two-dimensional electron gas behaves as a majority carrier. The first semiconductor layer has high electron density and high electron mobility, and in turn, low resistance. Accordingly, the series resistance is significantly lower and forward on-state resistance of the diode is smaller than using another wide band gap material for the first semiconductor layer.

According to a second aspect of the invention, in the semiconductor device, the plurality of unit anode portions are made of a predetermined metal to create a Schottky junction between each of the plurality of unit anode portions and the first semiconductor layer.

This achieves a semiconductor device serving as a horizontal diode having high breakdown voltage and high output current density. A group-III nitride single crystal substrate having a thickness of several tens of microns or larger as used in a semiconductor device of vertical diode structure does not need to be used, and an epitaxial film formed on a predetermined base may be used as the first semiconductor layer, which achieves improved cost effectiveness. Further, an epitaxial film having high purity has fewer macroscopic defects than a group-III nitride single crystal substrate, and is uniform in a relatively large area, which can achieve a Schottky junction type diode having smaller leakage current than a diode of vertical diode structure.

According to a third aspect of the invention, in the semiconductor device, each of a plurality of junctions between the plurality of unit anode portions and the first semiconductor layer includes a first junction and a second junction. At least part of each of the plurality of unit anode portions constituting the first junction that is connected to the first semiconductor layer is a second semiconductor layer made of a predetermined semiconductor material in which holes are majority carriers. A P—N junction is created at the first junction. At least part of each of the plurality of unit anode portions constituting the second junction that is connected to the first semiconductor layer is made of a predetermined metal, to thereby create a Schottky junction at the second junction.

This achieves a semiconductor device serving as a diode having a P—N junction and a Schottky junction in combination. Accordingly, the semiconductor device has more excellent properties achieving effects of the both structures.

It is therefore an object of the present invention to provide a semiconductor device suitable for power application.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
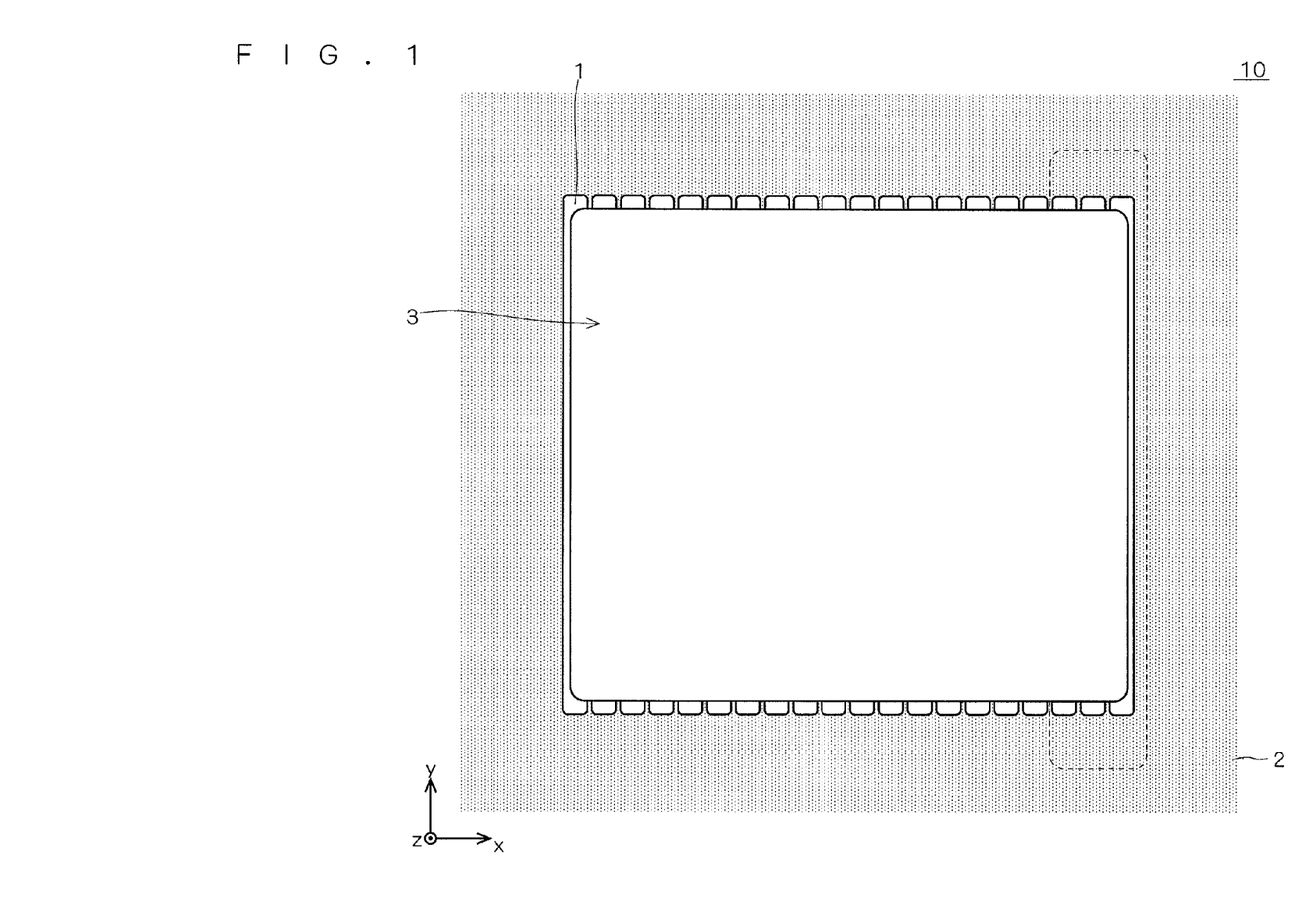
FIG. 1 is a top view of a semiconductor device according to a first preferred embodiment.
Figure 2:
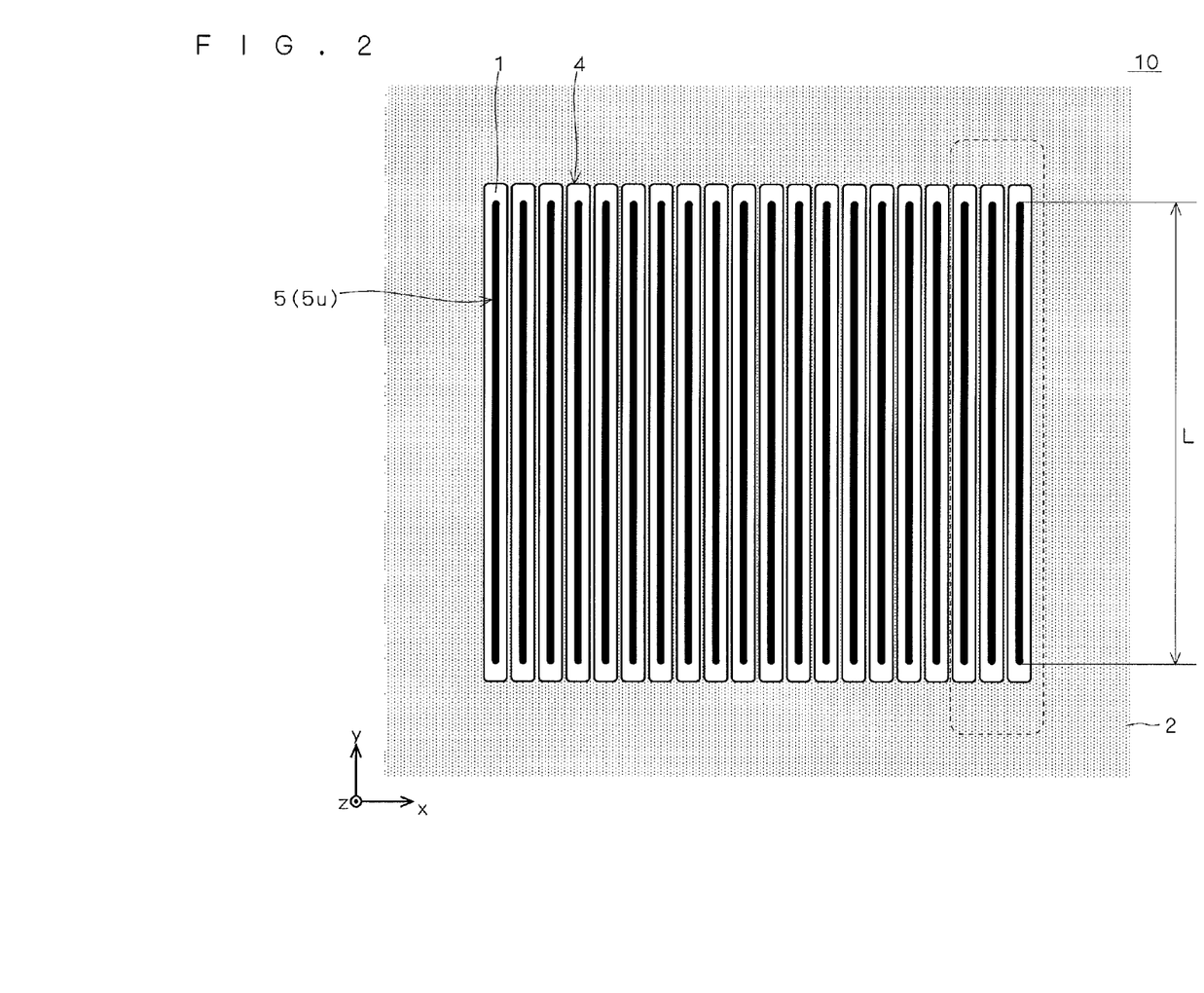
FIG. 2 is a top view of the semiconductor device with an electrode pad layer omitted.
Figure 3:
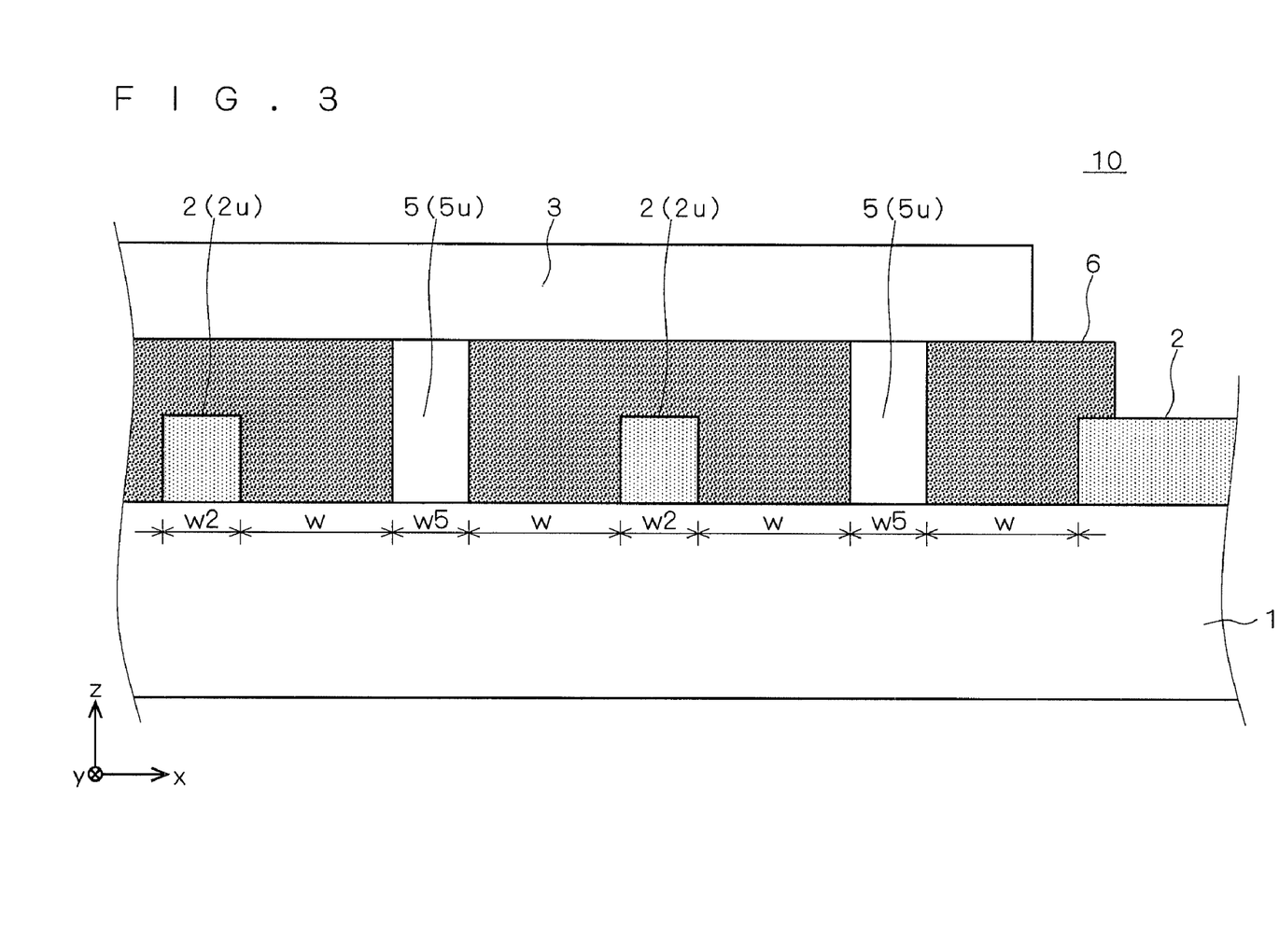
FIG. 3 is a partial enlarged cross sectional view of the semiconductor device.

Overall Structure of Semiconductor Device FIG. 1 is a top view of a semiconductor device 10 according to a first preferred embodiment of the present invention. As shown in FIG. 1, the semiconductor device 10 schematically includes a conductive layer 1, a cathode portion 2 and an electrode pad layer 3 both provided on the conductive layer 1. More specifically, the semiconductor device 10 has a structure as shown in FIGS. 2 and 3. FIG. 2 is a top view of the semiconductor device 10 with the electrode pad layer 3 omitted, and FIG. 3 is a cross sectional view of part indicated by broken lines in FIG. 1 (a corresponding part in FIG. 2 is also indicated by broken lines). Each part in the respective drawings including FIG. 1 is not always drawn at practical ratio.

In the semiconductor device 10, the cathode portion 2 is formed substantially on the entire surface of the conductive layer 1 as shown in FIG. 2, but at its central part, a plurality of rectangular hollow regions 4 where the cathode portion 2 is not formed are provided (by which the conductive layer 1 appears to be exposed in FIG. 2). In each of the hollow regions 4, a rectangular unit anode portion 5u having a predetermined length L in parallel to the longitudinal direction of the hollow regions 4 (along the y-axis in FIG. 2). A plurality of unit anode portions 5u will generically be called an anode portion 5. Part of the cathode portion 2 serving as the border of each hollow region 4 will particularly be called unit cathode electrodes 2u. Such unit cathode electrodes 2u also have a rectangular shape in parallel to the y-axis.

The unit cathode electrodes 2u and unit anode portions 5u are formed to have predetermined widths w2 and w5 in the horizontal direction (along the x-axis), respectively, as shown in FIG. 3. Each unit cathode electrode 2u and each unit anode portion 5u adjacent to each other are provided at a constant gap w. That is, the semiconductor device 10 includes the plurality of unit cathode electrodes 2u and plurality of unit anode portions 5u arranged horizontally in an alternating and uniformly spaced manner on the conductive layer 1 (where what is called electrode rows are formed).

The conductive layer 1 is an n-type semiconductor layer in which electrons are majority carriers, and is formed by, for example, doping a wide band gap material such as SiC or group-III nitride with a predetermined n-type dopant, namely, a donor element. The donor element may be N (nitrogen) in the case of SiC, and may be Si in the case of group-III nitride.

Alternatively, the conductive layer 1 may be formed by generating a two-dimensional electron gas layer using a group-III nitride as will be described later. In the latter case, a group-III nitride epitaxial film having a thickness of about several microns manufactured on a single crystal underlying substrate such as SiC or sapphire by a known technique such as MOCVD or HVPE.

The cathode portion 2 may be made of Ti/Al, for example. The unit cathode electrodes 2u each serve as a cathode in the semiconductor device 10. The cathode portion 2 is obtained by a known technique such as vacuum vapor deposition.

Figure 4:
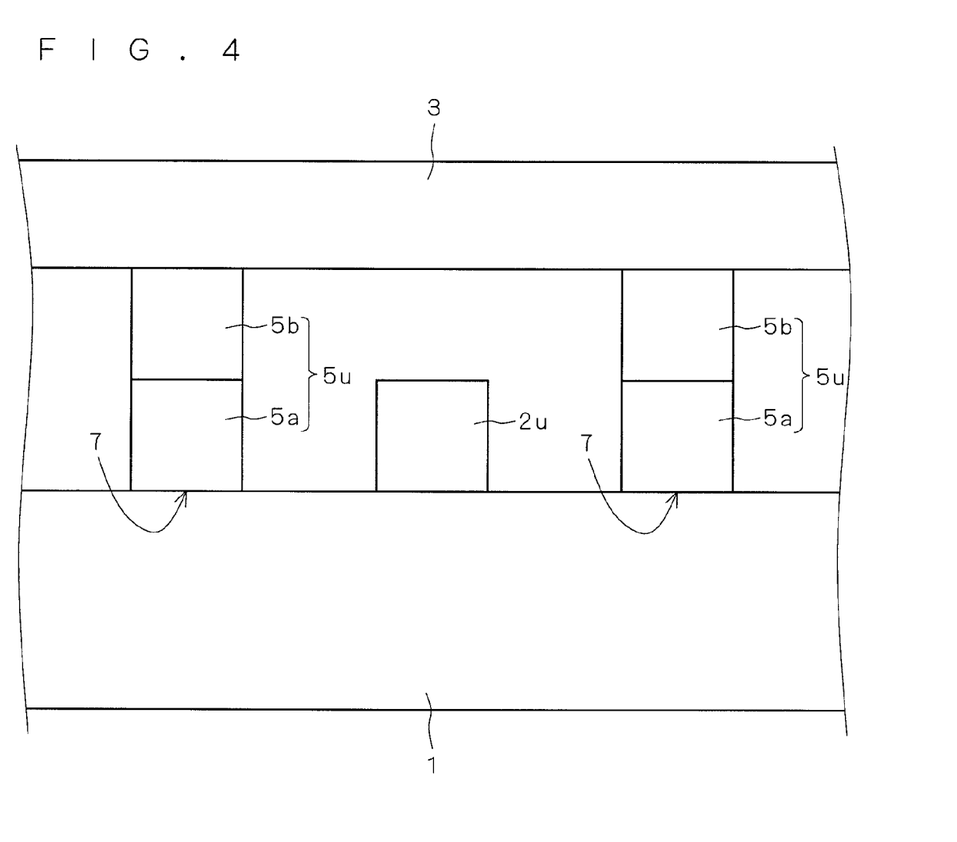
FIG. 4 is a diagram showing the structure of each unit anode portion in more detail.

FIG. 4 is a diagram showing the structure of each unit anode portion 5u constituting the anode portion 5 in more detail. Each unit anode portion 5u has a p-type layer 5a joined to the conductive layer 1 from above at the junction 7 and a unit anode electrode 5b stacked on the p-type layer 5a.

The p-type layer 5a is a p-type semiconductor layer in which holes are majority carriers, and is formed by, for example, doping a predetermined group-IV semiconductor material with a predetermined p-type dopant, namely, an acceptor element. Such acceptor element may be B (boron), for example.

Each unit anode electrode 5b serves as an anode in the semiconductor device 10, and may be made of Ni/Al, for example. Such unit anode portion 5u is obtained by a known technique such as vacuum vapor deposition.

While illustration is omitted in FIG. 2, an insulation protecting layer 6 for ensuring insulation of the cathode portion 2 from the anode portion 5 and electrode pad layer 3 is formed in a region schematically surrounded by the conductive layer 1, cathode portion 2, anode portion 5 and electrode pad layer 3. The insulation protecting layer 6 is made of SiN, for example.

In the semiconductor device 10 of such structure, the conductive layer 1 and each p-type layer 5a create a P—N junction at the junction 7, which means that a P—N junction diode structure is provided. The semiconductor device 10 serving as a P—N junction diode has properties of small leakage current, high peak surge current, and low forward on-state voltage at high voltage conduction.

Further, the anode electrode and cathode electrode are integrated horizontally so as to be adjacent to each other, which means that a horizontal diode structure having a main conduction pathway in the horizontal direction (in parallel to the surface) in the conductive layer 1 is provided in the semiconductor device 10.

A typical power diode often has the vertical diode structure rather than the horizontal diode structure in order to ensure high breakdown voltage and large output current per chip area. This is because a vertical diode can be provided with electrodes so that most part of the chip area is occupied by the electrodes, and thus has an advantage of increasing forward output current per chip area.

On the other hand, in the horizontal diode, the conduction cross section is determined by the outer length of electrodes and thickness of semiconductor layers, which requires increase in electrode area per chip by increasing the number of electrodes, increasing the area of each electrode or the like in order to increase output current. In addition, the arrangement of anode electrode and cathode electrode adjacently in the horizontal direction requires the gap between electrodes to be reduced in order to reduce the chip area. Generally, however, it is necessary to take note of the tradeoff between narrower gap between electrodes and smaller breakdown voltage during reverse blocking.

In the semiconductor device 10 according to the present embodiment, however, the conductive layer 1 is made of a wide band gap material having a breakdown field higher than silicon by about 1 order, and thus has the property of high breakdown voltage while presenting the horizontal diode structure. In other words, the present embodiment achieves a semiconductor device with the gap between electrodes smaller by about 1 order than a silicon-employed device having the same breakdown voltage. For instance, the present embodiment achieves a gap of about 20 μm between electrodes in a semiconductor device under the conditions requiring a gap of 200 μm between electrodes in a silicon-employed device.

Further, since rectangular electrodes are arranged in parallel as shown in FIGS. 2 and 3, the semiconductor device 10 is configured such that electrodes are integrated effectively in a small area while ensuring the outer length of electrodes per electrode area. The semiconductor device 10 accordingly has the property of large forward output current per chip area.

Further, the horizontal diode structure is characterized by smaller series resistance at conduction and smaller forward on-state resistance as the gap between electrodes in the horizontal direction decreases. Further, the conductive layer is not always required to be used as a substrate unlike in the vertical diode structure, which advantageously eliminates the need to ensure the thickness for handling by the thickness of the conductive layer. For instance, as described above, a group-III nitride epitaxial film having a thickness of about several microns may be formed on an underlying substrate such as SiC or sapphire and use this as a conductive layer. Such case is more cost effective than in the case of the vertical diode structure using a group-III nitride single crystal substrate having a thickness of about several tens of microns or larger. In addition, such structure eliminates the need to form a P-type conductive region like FLR in the vertical diode structure within the conductive layer 1, which advantageously achieves significant simplification of manufacturing steps.

Conductive Layer

As described above, the conductive layer 1 is preferably made of a group-III nitride having a composition of $Al_{1-x-y}Ga_xIn_yN$ ($x \geq 0$, $y \geq 0$, $0 \leq x+y \leq 1$). This allows electrodes to be integrated with higher densities. GaN may be used, for example.

Throughout the conductive layer 1, the group-III nitride is not required to be uniform in composition, but may have a gradient composition. Preferably, a group-III nitride having a composition of y=0, that is, $Al_{1-x}Ga_xN$ ($0 \leq x \leq 1$) is used at least in the vicinity of the junction 7. This allows the P—N junction at the junction 7 to be obtained with more excellent properties.

Figure 5:
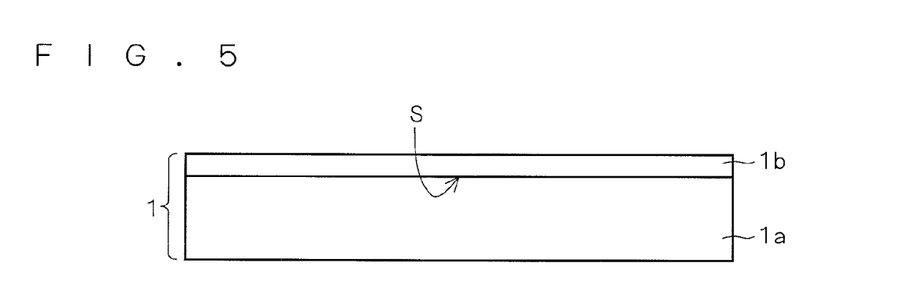
FIG. 5 is a diagram showing a conductive layer of two-layered structure.

Alternatively, the conductive layer 1 may be a stack of a plurality of layers made of group-III nitrides having different compositions. Such layered structure is easily manufactured using a known metal organic CVD technique or molecular beam epitaxial growth process, or combining them. FIG. 5 is a diagram showing the conductive layer 1 in such case.

FIG. 5 shows the conductive layer 1 having a two-layered structure of a first layer 1a and a second layer 1b. The first layer 1a and a second layer 1b are each made of a group-III nitride having a composition of y=0, that is, $Al_{1-x}Ga_xN$ ($0 \leq x \leq 1$), and are formed such that the group-III nitrides constituting these layers, respectively, have different band gaps at least at an adjacent area (namely, in the vicinity of the interface) of these layers.

When the conductive layer 1 has such layered structure, more specifically, the above-described relationship between the band gaps, a two-dimensional electron layer (what is called a two-dimensional electron gas layer) is generated in the vicinity of an interface S between the first and second layers 1a and 1b, where a two-dimensional electron gas behaves as a majority carrier. Accordingly, the conductive layer 1 has high electron density and high electron mobility, and in turn, low resistance. This allows significantly smaller series resistance and smaller forward on-state resistance of the diode than in the conductive layer 1 made of SiC or the like.

The first and second layers 1a and 1b as a whole are not required to be uniform in composition with the aforementioned requirements on band gaps being satisfied. For instance, they may have a gradient composition. Alternatively, the first and second layers 1a and 1b may each be formed of a group of a plurality of stacked layers made of group-III nitrides having different band gaps.

For instance, the second layer 1b is preferably formed in a thickness of about several nanometers to several tens of nanometers using a group-III nitride having a composition of $Al_{1-x}Ga_xN$ ($0 \leq x \leq 1$) at least in the vicinity of the junction 7. In this case, the second layer 1b may have a plurality of stacked layers made of group-III nitrides of $Al_{1-x}Ga_xN$ ($0 \leq x \leq 1$) having different compositions from each other (that is, a plurality of layers having different values for x). In such case, the second layer 1b may include an n-type conductive layer doped with Si, for example. Further, in terms of effective generation of a two-dimensional electron gas, it is more preferable to use AlN at an area adjacent to the first layer 1a.

The first layer 1a is preferably formed in a thickness of about several hundreds of nanometers to several microns using a group-III nitride having a composition of $Ga_{1-w}In_wN$ ($0 \leq w \leq 1$) at least at an area adjacent to the second layer 1b. In this case, the first layer 1a may have a plurality of stacked layers made of group-III nitrides of $Ga_{1-w}In_wN$ ($0 \leq w \leq 1$) having different compositions from each other (that is, a plurality of layers having different values for w). In such case, the first layer 1a may include an n-type conductive layer doped with Si, for example.

In terms of effective generation of a two-dimensional electron gas, it is more preferable to make the first layer 1a of GaN at least an area not adjacent to the second layer 1b. GaN has particularly an excellent crystal quality among group-III nitrides, and thus assures excellent crystallinity in the vicinity of the interface between the first and second layer 1a and 1b formed thereon to be responsible for conduction. This achieves still lower series resistance component at conduction, smaller leakage current during reverse blocking and suppression of decrease in breakdown voltage.

Further, it is more preferable to make the first layer 1a of GaN also at the area adjacent to the second layer 1b. This achieves still lower series resistance component at conduction, still smaller leakage current during reverse blocking and further suppression of decrease in breakdown voltage. In such case, the first layer 1a may include an n-type conductive layer doped with Si, for example.

It is desirable that the group-III nitride constituting the above-described layered structure should have a wurtzite crystal structure. It is further desirable that the interface should correspond to the wurtzite (0001) surface. This is because, with such structure, a two-dimensional electron gas is effectively generated based on the piezoelectronic polarization effect and spontaneous polarization effect produced within crystal, which also contributes to reduction of series resistance of the semiconductor device 10.

P-Type layer

As already described, the p-type layer 5a is formed by doping a predetermined group-IV semiconductor material with B (boron) as an acceptor element, and is preferably formed to have a hole density of $1 \times 10^{19}/cm^3$ or higher at least in the vicinity of the junction 7. With such composition, the p-type layer 5a has low resistivity in itself, and further, a contact resistance between the p-type layer 5a and unit anode electrode 5b can also be reduced. In addition, the depletion region can be prevented from extending into the p-type layer 5a during reverse blocking, allowing the p-type layer 5a to be formed thin. Under these reasons, a series resistance in the p-type layer 5a at forward conduction can be reduced. Such p-type layer 5a is easily obtained by doping an acceptor element such as B at a density of $1 \times 10^{20}/cm^3$ or higher.

The group-IV semiconductor material may be $Si_{1-z}Ge_z$ ($0 \leq z \leq 1$), for example. Such p-type layer 5a is easily deposited in a thickness not more than submicron order to several microns on the conductive layer 1 by using known various physical and chemical vapor deposition techniques such as CVD, sputtering, and vapor deposition. Among others, Si is suitable in terms of high controllability in layer formation. In such case, Si may be polycrystalline.

Since $Si_{1-z}Ge_z$ ($0 \leq z \leq 1$) has a smaller band gap than a group-III nitride of $Al_xGa_yN$ ($x+y=1$), creating a P—N junction at the junction 7 by the conductive layer 1 made of a group-III nitride of $Al_xGa_yN$ ($x+y=1$) at least in the vicinity of the junction 7 and the p-type layer 5a made of $Si_{1-z}Ge_z$ ($0 \leq z \leq 1$) at least in the vicinity of the junction 7 allows the top of a valence band energy of $Si_{1-z}Ge_z$ ($0 \leq z \leq 1$) to be significantly higher than the top of a valence band energy of $Al_xGa_yN$ ($x+y=1$). This prevents holes from being injected from the p-type layer 5a into the conductive layer 1 at forward conduction, allowing the semiconductor device 10 to serve as a P—N junction diode in which only electrons are carriers that dominate conduction. In such semiconductor device 10, reverse recovery current at shutoff is extremely less likely to flow because carriers at conduction are electrons only. That is, the semiconductor device 10 according to the present embodiment is characterized by short reverse recovery time while being a P—N junction diode. Further, electrons included in the p-type layer 5a exist at extremely small densities, which achieves the effect of significantly reducing reverse leakage current during reverse blocking.

Electrode Pad Layer

As already described, the semiconductor device 10 includes the electrode pad layer 3, which is connected to the top of each unit anode electrode 5b as shown in FIG. 3. Such electrode pad layer 3 is made of Al, for example. The unit anode electrodes 5b are connected electrically to each other by the electrode pad layer 3. Accordingly, the electrode pad layer 3 itself serves as an anode. In other words, the electrode pad layer 3 provided with a plurality of unit anode electrodes 5b on its lower main surface may be considered as the anode of the semiconductor device 10. The effects of a horizontal diode may be achieved only by electrically connecting the unit anode electrodes 5b to each other without necessarily providing the electrode pad layer 3, however, providing the electrode pad layer 3 exerts the effect of facilitating packaging of the semiconductor device 10 without additionally increasing the chip area.

While electric field concentration during reverse blocking is essentially most likely to occur at the junction 7 presenting the P—N junction in the semiconductor device 10 according to the present embodiment, providing the electrode pad layer 3 thereon with the insulation protecting layer 6 interposed therebetween exerts the effect of relieving electric field concentration at the junction 7. This contributes to improved breakdown voltage during reverse blocking.

The present embodiment as described above provides a semiconductor device serving as a P—N junction horizontal diode and satisfying the requirements of: (1) small leakage current during reverse blocking; (2) high breakdown voltage during reverse blocking; (3) large output current at forward conduction; (4) short reverse recovery time at shutoff; and further, (5) high peak surge current value.

Second Preferred Embodiment

While the first preferred embodiment has described the semiconductor device 10 serving as a P—N junction horizontal diode by forming each unit anode portion 5u to have a two-layered structure of p-type layer 5a and unit anode electrode 5b and creating the P—N junction between the conductive layer 1 and p-type layer 5a, the horizontal diode is not limited to a P—N junction type. The present embodiment will be directed to a semiconductor device 10 serving as a Schottky junction horizontal diode.

More specifically, a Schottky junction horizontal diode structure is obtained by forming all the unit anode portions 5u to have a Schottky junction with the conductive layer 1 using a predetermined metal, rather than forming each unit anode portion 5u shown in FIGS. 2 and 3 to have a two-layered structure of p-type layer 5a and unit anode electrode 5b as shown in FIG. 4. Such unit anode portion 5u may be made of Ni, for example.

The semiconductor device 10 having such Schottky junction structure is characterized by low voltage at rising edge of current and extremely short reverse recovery time because reverse current does not flow in principle.

Further, with such horizontal diode structure, a homogenous epitaxial film of high purity having fewer macroscopic defects than a group-III nitride single crystal substrate is formed on a predetermined base across a relatively wide area, and this film is used as the conductive layer 1. Accordingly, a diode, though being of Schottky junction type, having smaller leakage current than a vertical diode which requires a group-III nitride single crystal substrate can be obtained.

Since the arrangement of other parts is the same as in the first preferred embodiment, the effects obtained by such arrangement are also similarly obtained in the Schottky junction structure. More specifically, the effects obtained when making the conductive layer 1 of a group-III nitride, particularly, among others the effect of two-dimensional electron gas when employing the layered structure is similar to that of the first preferred embodiment. Further, providing the electrode pad layer 3 exerts the effect of relieving electric field concentration at the junction 7 presenting the Schottky junction.

The present embodiment, as described above, provides a Schottky junction horizontal diode with excellent properties.

Third Preferred Embodiment

Figure 6:
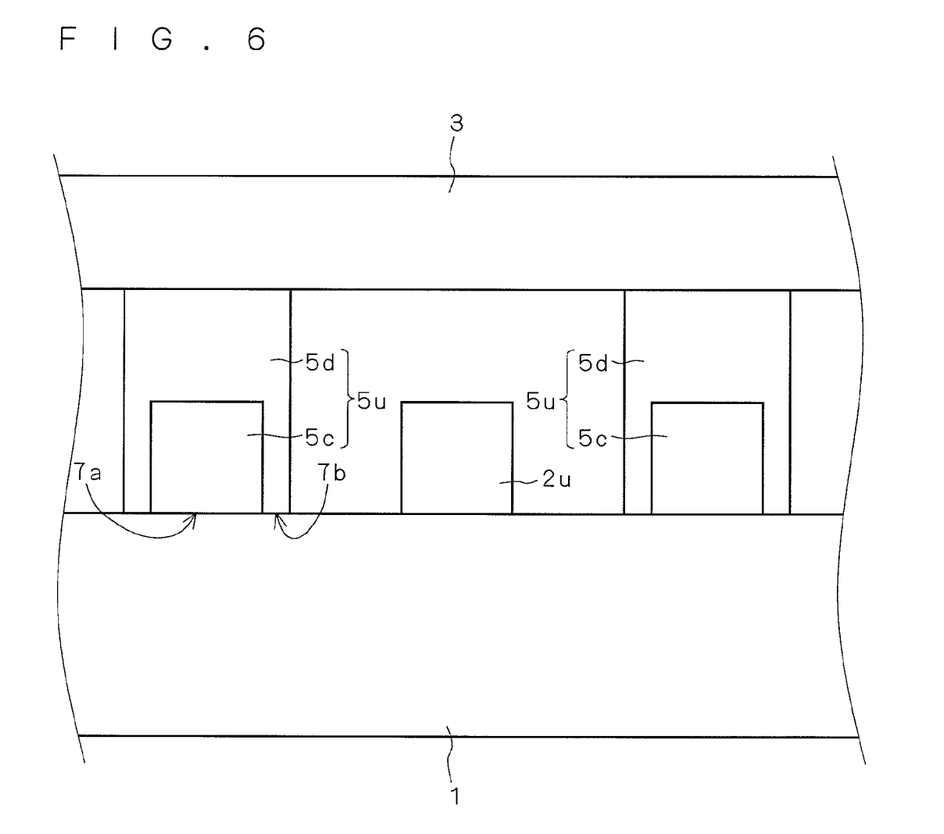
FIG. 6 is a diagram for explaining the structure of each unit anode portion according to a third preferred embodiment.

The present embodiment will be directed to a semiconductor device 10 of horizontal diode structure having a P—N junction and a Schottky junction in combination. FIG. 6 is a diagram for explaining the structure of each unit anode portion 5u according to the present embodiment. Such horizontal diode of combined structure is obtained by forming each unit anode portion 5u shown in FIGS. 2 and 3 into the form as shown in FIG. 6, rather than FIG. 4.

More specifically, each unit anode electrode part 5u includes a p-type layer 5c and a unit anode electrode 5d. The p-type layer 5c is joined to the conductive layer 1 from above at a junction 7a. The p-type layer 5c is a p-type semiconductor layer in which holes are majority carriers, and is formed similarly to the p-type layer 5a according to the first preferred embodiment. The unit anode electrode 5d is provided between the p-type layer 5c and electrode pad layer 3 similarly to the unit anode electrode 5b according to the first preferred embodiment, and is formed to be directly in Schottky junction with the conductive layer 1 at a junction 7b. The unit anode electrode 5d serves as an anode in the semiconductor device. The unit anode portion 5u can be formed by a technique similar to the first preferred embodiment.

Accordingly, the conductive layer 1 and p-type layer 5c creates a P—N junction at the junction 7a, while the conductive layer 1 and unit anode electrode 5d creates a Schottky junction at the junction 7b. That is, the semiconductor device 10 presents a combined structure of P—N junction and Schottky junction. Thus, current flows through the Schottky junction at low voltage conduction, while current induced by carrier injection flows through the P—N junction at high voltage conduction. The former contributes to decrease in voltage at the rising edge of current, and the latter contributes to ensure the operation at low on-state voltage.

During reverse blocking, current is blocked at the P—N junction, which ensures high breakdown voltage.

Since the arrangement of other parts is the same as in the first preferred embodiment, the effects obtained by such arrangement are also similar to the first preferred embodiment.

According to the present embodiment as described above, forming the horizontal diode semiconductor device with the combined structure of P—N junction and Schottky junction achieves effects resulting from the Schottky junction in addition to the effects obtained by the P—N junction semiconductor device according to the first preferred embodiment. Therefore, a semiconductor device with more excellent properties can be obtained.

EXAMPLES

First Example

In this example the semiconductor device 10 according to the first preferred embodiment was prepared, and its properties were evaluated. The conductive layer 1 was manufactured as shown in FIG. 5, with 20 pairs of unit anode portion 5u and unit cathode electrode 2u integrated on one chip.

First, a GaN layer having a thickness of 3 µm was formed as the first layer 1a on a single crystal SiC substrate by MOCVD with a buffer layer made of AlN having a thickness of 300 nm interposed therebetween, and an $Al_{0.3}Ga_{0.7}N$ layer having a thickness of 20 nm was further formed as the second layer 1b. Electric properties of the conductive layer 1 at this time were evaluated by a Hall coefficient measurement to obtain a two-dimensional electron density of about $1\times10^{13}/cm^2$, an electron mobility of about 1400 $cm^2/Vs$, and a sheet resistance of about 450 $\Omega/sq$. An X-ray diffraction measurement was conducted to find out that a wurtzite crystal structure was grown sequentially along the c axis.

Next, a metal layer made of Ti/Al was formed as the cathode portion 2 as shown in FIGS. 2 and 3 by photolithography and vacuum vapor deposition, that is, such that each unit anode portion 5u is to be positioned in each hollow region 4. Each unit cathode electrode 2u was formed to have a width w2 of 10 µm. An alloy layer was then formed at a metal-semiconductor interface by heat treatment in nitrogen. The unit cathode electrode 2 was thereby obtained.

Thereafter, the insulation protecting layer 6 was formed of SiN to have contact holes for conduction with each unit anode electrode 5b, and the electrode pad layer 3 was made of Al in a thickness of 5 µm.

Finally, dicing was conducted such that each chip had a 2 µm×2 µm square shape in plan view, and each obtained chip was packaged in a predetermined package to obtain the semiconductor device 10.

Thus manufactured semiconductor device 10 was measured in leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A.

Second Example

Processing was conducted similarly to the first example except forming each unit anode portion 5$u$ of Ni layer, to thereby obtain the semiconductor device according to the second preferred embodiment.

Thus manufactured semiconductor device 10 was measured in leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A.

Third Example

The semiconductor device 10 was manufactured similarly to the first example except that the conductive layer 1 included the first layer 1$a$ and second layer 1$b$, and the second layer 1$b$ had a two-layered structure. More specifically, a GaN layer having a thickness of 3 µm was formed as a first layer 1$a$ on a single crystal SiC substrate by MOCVD with a buffer layer made of AlN having a thickness of 300 nm interposed therebetween, then, an AlN layer having a thickness of 1 nm and an $Al_{0.3}Ga_{0.7}N$ layer having a thickness of 20 nm were further formed as the second layer 1$b$. Electric properties of the conductive layer 1 at this time were evaluated by the Hall coefficient measurement to obtain a two-dimensional electron density of about $1\times10^{13}/cm^2$, an electron mobility of about 2200 $cm^2/Vs$, and a sheet resistance of about 260 Ω/sq. The X-ray diffraction measurement was conducted to find out that a wurtzite crystal structure was grown sequentially along the c axis.

Thus manufactured semiconductor device 10 was measured in leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A.

Fourth Example

The semiconductor device 10 was manufactured similarly to the first example except that the conductive layer 1 included the first layer 1$a$ and second layer 1$b$, and the second layer 1$b$ had a two-layered structure. More specifically, a GaN layer having a thickness of 3 µm and an $In_{0.05}Ga_{0.95}N$ layer having a thickness of 20 nm were formed as a first layer 1$a$ on a single crystal SiC substrate by MOCVD with a buffer layer made of AlN having a thickness of 300 nm interposed therebetween, then, an $Al_{0.3}Ga_{0.7}N$ layer having a thickness of 20 nm was further formed as the second layer 1$b$. Electric properties of the conductive layer 1 at this time were evaluated by the Hall coefficient measurement to obtain a two-dimensional electron density of about $1.4\times10^{13}/cm^2$, an electron mobility of about 800 $cm^2/Vs$, and a sheet resistance of about 560 Ω/sq. The X-ray diffraction measurement was conducted to find out that a wurtzite crystal structure was grown sequentially along the c axis.

Thus manufactured semiconductor device 10 was measured in leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A.

Comparative Example

Figure 7A:
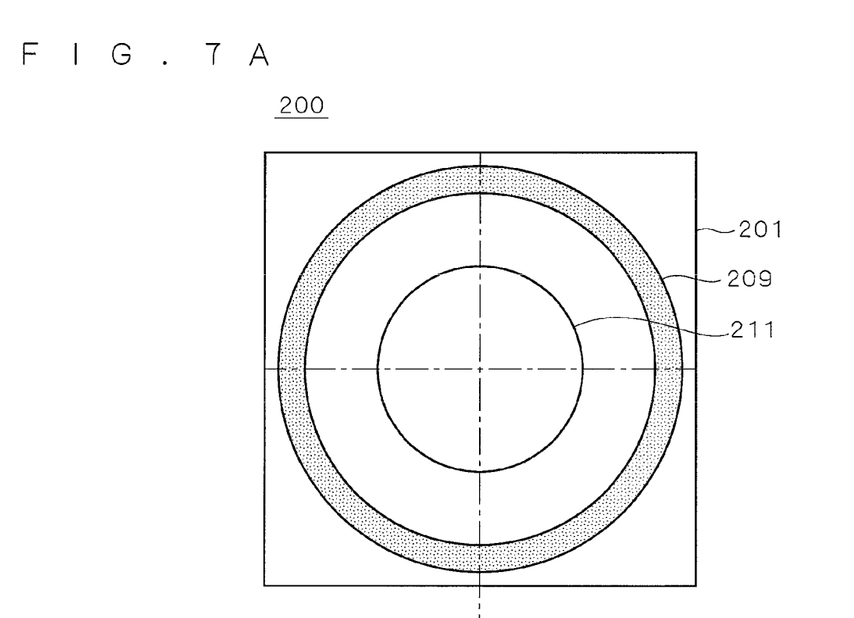
FIGS. 7A and 7B are diagrams showing a vertical diode according to a comparative example.
Figure 7B:
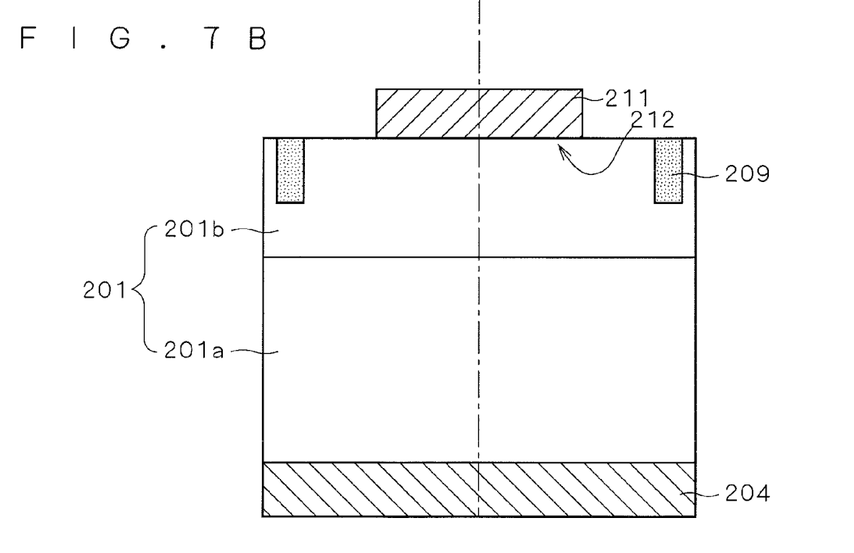

As a comparative example, a Schottky-junction vertical diode was prepared. FIGS. 7A and 7B show the structure of a vertical diode 200.

First, an n-type GaN substrate 201$a$ having a thickness of 300 µm having an electron density of $1\times10^{18}/cm^3$ was prepared. A GaN film 201$b$ having an electron density of $1\times10^{16}/cm^3$ was formed thereon by MOCVD in a thickness of 5 µm, to thereby obtain an n-type layer 201 which is an n-type semiconductor layer.

Next, by ion implantation of Mg into part of the surface of the GaN film 201$b$ and subsequent heat treatment for activating Mg, a field limiting ring 209 made of p-type GaN having a hole density of $1\times10^{18}/cm^3$ was formed.

Subsequently, a metal layer made of Ti/Al was deposited on the rear surface of the GaN substrate 201$a$ (opposite to the Si-layer-formed surface). An alloy layer was then formed at a metal-semiconductor interface by heat treatment in nitrogen. A cathode electrode 204 was thereby obtained.

Further, a metal layer made of Ni was formed as an anode electrode 211 on the n-type layer 201 in the form of a disc having a diameter of 1 mm in plan view. An insulation protecting film made of SiN not shown was formed so as to expose metal electrodes only.

Finally, dicing was conducted such that each chip had a 2 µm×2 µm square shape in plan view with the center of the anode electrode 211 aligned with the center of each chip, and each obtained chip was packaged in a predetermined package to obtain the vertical diode 200.

Thus manufactured vertical diode 200 was measured in leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A.

Comparison Between Examples and Comparative Example

Figure 8:
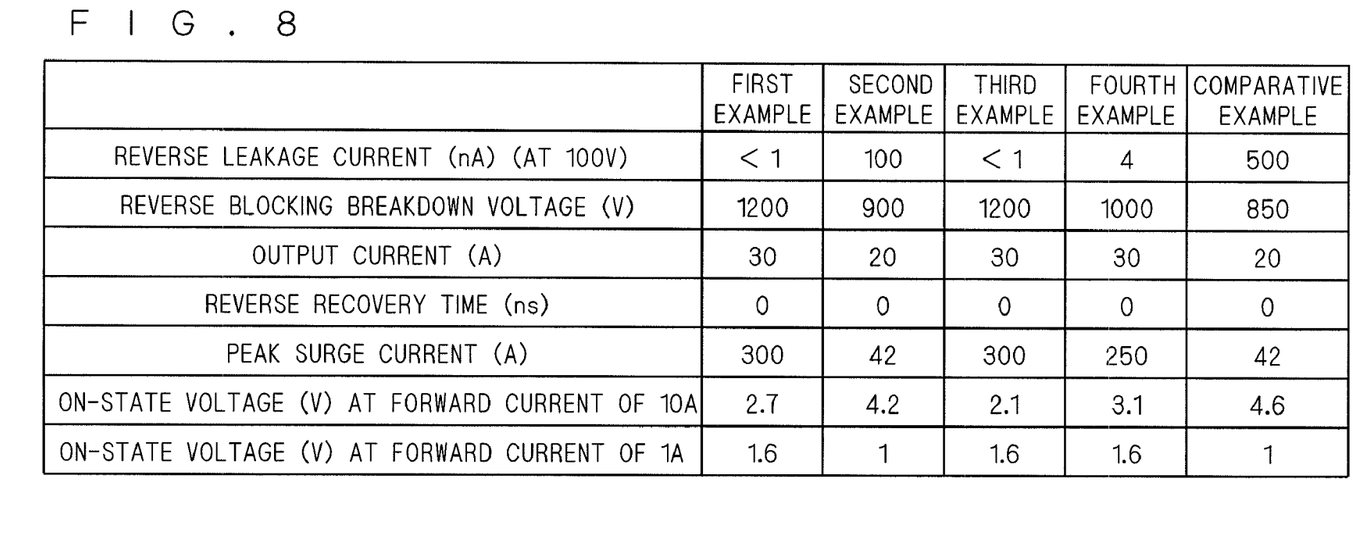
FIG. 8 is a table listing measurements obtained in examples and comparative example.

FIG. 8 is a table listing leakage current during reverse blocking, reverse blocking breakdown voltage (dielectric breakdown voltage), forward output current, reverse recovery time, peak surge current, on-state voltage at a forward current of 10 A and on-state voltage at a forward current of 1 A, each measured in the first example, second example and comparative example, respectively.

As understood from FIG. 8, either the first, third or fourth example directed to forming the semiconductor device having a P—N junction horizontal diode structure shows the results of extremely smaller leakage current and higher breakdown voltage during reverse blocking than the comparative example, large output current at forward conduction, extremely high peak surge current value, and in addition, a reverse recovery time of 0 which has been difficult to achieve by conventional P—N junction devices.

The second example directed to forming the semiconductor device having a Schottky junction horizontal diode structure shows the result of sufficiently smaller leakage current during reverse blocking than the comparative example, and other results are equal to or better than the comparative example.

While the invention has been shown and described in detail, the foregoing description is in all aspects illustrative and not restrictive. It is therefore understood that numerous modifications and variations can be devised without departing from the scope of the invention. For instance, the cathode electrode according to the present invention is obtained by an ohmic contact between the semiconductor layer and metal electrodes, but may be obtained by doping impurities locally into the semiconductor layer by ion implantation or external diffusion in order to reduce the contact resistance of the ohmic contact, inserting a semiconductor layer doped with impurities or a layered structure of such semiconductor layers, locally carrying out etching, or the like.

Further, in order to reduce a warp in the epitaxial substrate and achieve improved crystallinity of the nitride film, a multilayer film such as a buffer layer or strained super lattice may be inserted into the group-III nitride layer as an intermediate layer.

What is claimed is:

1. A semiconductor device comprising:
   a first semiconductor layer made of a wide band gap material in which electrons are majority carriers;
   an anode portion including a plurality of unit anode portions and a single metal layer, said plurality of unit anode portions each being joined to a main surface of said first semiconductor layer, wherein a part of each of said plurality of unit anode portions joined to said first semiconductor layer is a second semiconductor layer made of a predetermined semiconductor material in which holes are majority carriers, and only a P-N junction is created at a junction between said first and second semiconductor layers;
   a cathode portion including a plurality of unit cathodes, said plurality of unit cathodes each being joined to said main surface and being electrically connected to each other; and
   an insulation layer for insulating said anode portion and said cathode portion, wherein
   electrode rows including each of said plurality of unit anode portions and each of said plurality of unit cathodes arranged alternately are formed on said main surface,
   said insulation layer is provided so as to cover at least said plurality of unit cathodes, and
   the entirety of said single metal layer is formed on said insulation layer and makes a conductive connection with said plurality of unit anode portions whereby said plurality of unit anode portions are electrically connected to each other.

2. The semiconductor device according to claim 1, wherein said first semiconductor layer is a stack of first and second nitride layers, each being made of a group-III nitride having a composition of $Al_{1-x-y}Ga_xIn_yN$ ($x \geq 0$, $y \geq 0$, $0 \leq x+y \leq 1$) and being different in band gaps at least in an area where said first and second nitride layers are adjacent to each other.

3. The semiconductor device according to claim 2, wherein said first and second nitride layers are epitaxially formed on a predetermined single crystal base.

4. The semiconductor device according to claim 2, wherein said first semiconductor layer is formed such that said plurality of unit anode portions are formed on a main surface of said second nitride layer, and the group-III nitride constituting said first nitride layer has a band gap wider than the group-III nitride constituting said second nitride layer at least in an area where said first and second nitride layers are adjacent to each other.

5. The semiconductor device according to claim 4, wherein said second nitride layer is made of a group-III nitride having a composition of $Al_{1-x}Ga_xN$ ($0 \leq x \leq 1$).

6. The semiconductor device according to claim 5, wherein said second nitride layer is made of AlN at least in an area adjacent to said first nitride layer.

7. The semiconductor device according to claim 4, wherein said first nitride layer is made of a group-III nitride having a composition of $Ga_{1-w}In_wN$ ($0 \leq w \leq 1$) at least in an area adjacent to said second nitride layer.

8. The semiconductor device according to claim 7, wherein said first nitride layer is made of GaN at least in an area not adjacent to said second nitride layer.

9. The semiconductor device according to claim 8, wherein said first nitride layer is made of GaN.

10. The semiconductor device according to claim 4, wherein
    said first and second nitride layers are each made of a group-III nitride having a wurtzite structure with each of their main surfaces corresponding to a (0001) surface.

11. The semiconductor device according to claim 1, wherein
    at least part of said first semiconductor layer that is joined to said anode portion is made of a group-III nitride having a composition of $Al_{1-x}Ga_xN$ ($0 \leq x \leq 1$).

12. The semiconductor device according to claim 1, wherein
    said second semiconductor layer has a hole density of $1 \times 10^{19}/cm^3$ or higher at least in an area joined to said first semiconductor layer.

13. The semiconductor device according to claim 12, wherein
    said predetermined semiconductor material is a group-IV semiconductor.

14. The semiconductor device according to claim 13, wherein
    said predetermined semiconductor material is $Si_{1-z}Ge_z$ ($0 \leq z \leq 1$) at least in an area joined to said first semiconductor layer.

15. The semiconductor device according to claim 14, wherein
    said predetermined semiconductor material is Si at least in an area joined to said first semiconductor layer.

16. The semiconductor device according to claim 1, wherein
    said second semiconductor layer has an acceptor density of $2 \times 10^{20}/cm^3$ or higher at least in an area joined to said first semiconductor layer.

17. A semiconductor device comprising:
    a first semiconductor layer made of a wide band gap material in which electrons are majority carriers;
    an anode portion including a plurality of unit anode portions and a metal layer, said plurality of unit anode portions each being joined to a main surface of said first semiconductor layer, wherein a part of each of said plurality of unit anode portions joined to said first semiconductor layer is a second semiconductor layer made of a predetermined semiconductor material in which holes are majority carriers, and only a P-N junction is created at a junction between said first and second semiconductor layers;

a cathode portion including a plurality of unit cathodes, said plurality of unit cathodes each being joined to said main surface and being electrically connected to each other; and an insulation layer for insulating said anode portion and said cathode portion, wherein said cathode portion is formed substantially on the entire surface of said first semiconductor layer but has a plurality of hollow regions, the border of each of said plurality of hollow regions constituting each of said plurality of unit cathodes, electrode rows including each of said plurality of unit anode portions and each of said plurality of unit cathodes arranged alternately are formed on said main surface, said insulation layer is provided to cover at least said plurality of unit cathodes, and said metal layer is formed on said insulation layer and makes a conductive connection with said plurality of unit anode portions, whereby said plurality of unit anode portions are electrically connected to each other.

18. A semiconductor device comprising:

a first semiconductor layer made of a wide band gap material in which electrons are majority carriers;

an anode portion including a plurality of unit anode portions and a single metal layer, said plurality of unit anode portions each being joined to a main surface of said first semiconductor layer;

a cathode portion including a plurality of unit cathodes, said plurality of unit cathodes each being joined to said main surface and being electrically connected to each other; and an insulation layer for insulating said anode portion and said cathode portion, wherein each of a plurality of junctions between said plurality of unit anode portions and said first semiconductor layer includes a first junction and a second junction, a first part of each of said plurality of unit anode portions connected to said first semiconductor layer and constituting said first junction, is a second semiconductor layer made of a predetermined semiconductor material in which holes are majority carriers, a P-N junction is created at said first junction, a second part of each of said plurality of unit anode portions connected to said first semiconductor layer and constituting said second junction, is made of a predetermined metal, to thereby create a Schottky junction at said second junction, said second semiconductor layer is physically located inside of said second part of said unit anode portion, electrode rows including each of said plurality of unit anode portions and each of said plurality of unit cathodes arranged alternately are formed on said main surface, said insulation layer is provided so as to cover at least said plurality of unit cathodes, and the entirety of said single metal layer is formed on said insulation layer and make a conductive connection with said plurality of unit anode portions, whereby said plurality of unit anode portions being electrically connected to each other.

19. A semiconductor device comprising:

a first semiconductor layer made of a wide band gap material in which electrons are majority carriers;

an anode portion including a plurality of unit anode portions and a metal layer, said plurality of unit anode portions each being joined to a main surface of said first semiconductor layer;

a cathode portion including a plurality of unit cathodes, said plurality of unit cathodes each being joined to said main surface and being electrically connected to each other; and an insulation layer for insulating said anode portion to said cathodes portion, wherein each of a plurality of junctions between said plurality of unit anode portions and said first semiconductor layer includes a first junction and a second junction, a first part of each of said plurality of unit anode portions connected to said first semiconductor layer and constituting said first junction, is a second semiconductor layer made of a predetermined semiconductor material in which holes are majority carriers, a P-N junction is created at said first junction, a second part of each of said plurality of unit anode portions connected to said first semiconductor layer and constituting said second junction, is made of a predetermined metal, to thereby create a Schottky junction at said second junction, said second semiconductor layer is physically located inside of said second part of said unit anode portion, said cathode portion is formed substantially on the entire surface of said first semiconductor layer but has a plurality of hollow regions, the border of each of said plurality of hollow regions constituting each of said plurality of unit cathodes, electrode rows including each of said plurality of unit anode portions and each of said plurality of unit cathodes arranged alternately are formed on said main surface, said insulation layer is provided to cover at least said plurality of unit cathodes, and said metal layer is formed on said insulation layer and make a conductive connection with said plurality of unit anode portions, whereby said plurality of unit anode portions being electrically connected to each other.

* * * * *